United States Patent
Koh et al.

(10) Patent No.: US 10,334,736 B2
(45) Date of Patent: *Jun. 25, 2019

(54) FLEXIBLE INTEGRATED CIRCUIT THAT INCLUDES AN ANTENNA

(71) Applicant: Intel Corporation, Santa Clara, CA (US)

(72) Inventors: Boon Ping Koh, Seberang Jaya (MY); Bok Eng Cheah, Bukit Gambir (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/795,189

(22) Filed: Oct. 26, 2017

(65) Prior Publication Data

US 2018/0049326 A1    Feb. 15, 2018

Related U.S. Application Data

(63) Continuation of application No. 14/978,264, filed on Dec. 22, 2015, now Pat. No. 9,839,134.

(51) Int. Cl.
*H05K 1/00* (2006.01)
*H05K 1/18* (2006.01)
(Continued)

(52) U.S. Cl.
CPC ............. *H05K 1/189* (2013.01); *H01L 24/19* (2013.01); *H01Q 1/2291* (2013.01); *H01Q 1/38* (2013.01);
(Continued)

(58) Field of Classification Search
CPC .... H05K 1/021; H05K 1/0212; H05K 1/0215; H05K 1/023; H05K 1/0231;
(Continued)

(56) References Cited

U.S. PATENT DOCUMENTS

2003/0103006 A1    6/2003  Yamada
2005/0189645 A1*   9/2005  Nakano ............... H05K 1/162
                                                    257/701
(Continued)

FOREIGN PATENT DOCUMENTS

WO    WO-2017112250 A1    6/2017

OTHER PUBLICATIONS

"U.S. Appl. No. 14/978,264, Notice of Allowance dated Aug. 11, 2017", 12 pgs.

(Continued)

*Primary Examiner* — Pete T Lee
(74) *Attorney, Agent, or Firm* — Schwegman Lundberg & Woessner, P.A.

(57) ABSTRACT

A flexible integrated circuit that includes a first dielectric layer having a first section at one polarity and a second section at an opposing polarity, wherein the first section and the second section are separated by dielectric material within first dielectric layer; a second dielectric layer having a first side wall that is electrically connected to the first section and a second side wall that is electrically connected to the second section; and a third dielectric layer having a base that is electrically connected to the first side wall and the second side wall, wherein the second dielectric layer is between the first dielectric layer and the third dielectric layer, wherein the base, the first and second side walls and the first and second sections form an antenna that is configured to send or receive wireless signals.

19 Claims, 5 Drawing Sheets

(51) Int. Cl.
*H01Q 1/38* (2006.01)
*H01Q 1/22* (2006.01)
*H01Q 9/28* (2006.01)
*H01L 23/00* (2006.01)
*H05K 1/16* (2006.01)

(52) U.S. Cl.
CPC ..... *H01Q 9/285* (2013.01); *H01L 2223/6677* (2013.01); *H01L 2224/04105* (2013.01); *H01L 2224/24137* (2013.01); *H01L 2924/18162* (2013.01); *H05K 1/165* (2013.01); *H05K 1/185* (2013.01); *H05K 2201/0154* (2013.01); *H05K 2201/10098* (2013.01); *H05K 2203/1469* (2013.01)

(58) Field of Classification Search
CPC .. H05K 1/0233; H05K 1/0234; H05K 1/0243; H05K 1/0295; H05K 1/14; H05K 1/141; H05K 1/142; H05K 1/144; H05K 1/145; H05K 1/16; H05K 1/162; H05K 1/165; H05K 1/167; H05K 1/18; H05K 1/181; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10477; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46; H05K 1/0213; H05K 1/0216; H05K 1/0218; H05K 1/0219; H05K 1/0224; H05K 1/0227; H05K 1/0228; H05K 1/0236; H05K 1/0237; H05K 1/0239; H05K 1/024; H05K 1/0242; H05K 1/0245; H05K 1/0246; H05K 1/0248; H05K 1/025; H05K 1/0253; H05K 1/0254; H05K 1/0256; H05K 1/0257; H05K 1/0259; H05K 1/026; H05K 1/0263; H05K 1/0265; H05K 1/0278; H05K 1/0284; H05K 1/0296; H05K 1/0298; H05K 1/036; H05K 1/0366; H05K 1/0373; H05K 1/0393; H05K 1/05; H05K 1/11; H05K 1/111; H05K 1/114; H05K 1/117; H05K 1/119; H05K 2201/10378; H05K 3/4602; H05K 3/4691; H05K 1/0277; H05K 1/028; H05K 1/0281; H05K 1/0283; H05K 1/118; H05K 1/147; H05K 1/148; H05K 1/189; H05K 2201/042; H05K 2201/046; H05K 2201/05; H05K 3/4046; H01L 23/28; H01L 24/50

See application file for complete search history.

(56) References Cited

U.S. PATENT DOCUMENTS

| | | | |
|---|---|---|---|
| 2006/0058000 A1* | 3/2006 | Block | .............. H01L 23/49822 455/333 |
| 2009/0160719 A1 | 6/2009 | Kato et al. | |
| 2012/0299782 A1* | 11/2012 | Chou | .................. H01Q 9/0421 343/700 MS |
| 2013/0194754 A1 | 8/2013 | Jung et al. | |
| 2013/0223034 A1 | 8/2013 | Rathburn | |
| 2014/0210672 A1 | 7/2014 | Chiu et al. | |
| 2017/0181289 A1 | 6/2017 | Koh et al. | |

OTHER PUBLICATIONS

"International Application Serial No. PCT/US2016/063307, International Search Report dated Mar. 6, 2017", 3 pgs.
"International Application Serial No. PCT/US2016/063307, Written Opinion dated Mar. 6, 2017", 6 pgs.

\* cited by examiner

ATTACH SILICON DEVICES ON CARRIER

*FIG. 5A*

OVERMOLD SILICON DEVICES WITH FLEXIBLE MATERIAL

*FIG. 5B*

ATTACH SECOND CARRIER AND REMOVE FIRST CARRIER

*FIG. 5C*

LAYER BUILDUP PROCESS

FIG. 5D

SECOND ENCAPSULANT LAYER

FIG. 5E

REMOVE CARRIER

FLEXIBLE INTEGRATED CIRCUIT THAT INCLUDES AN ANTENNA

CROSS-REFERENCE TO RELATED APPLICATION

This application is a continuation of U.S. patent application Ser. No. 14/978,264, filed Dec. 22, 2015, which is incorporated by reference herein in its entirety.

TECHNICAL FIELD

Embodiments described herein generally relate to a flexible integrated circuit, and more particularly to a flexible integrated circuit that includes an antenna.

BACKGROUND

Conventional flexible/wearable computing applications typically use stand-alone rigid devices (e.g., smart watches or glasses), or rigid bulky packs that snap into a connector on a garment or belt. Other types of applications use flexible/conformable patches in which electronic devices are integrated into a patch that is then adhesively bonded to the skin. Healthcare and fitness are example applications that may utilize such computing devices.

One of the major design challenges that is associated with developing flexible/wearable computing devices is the incorporation of antennas into such electronic devices. It is usually difficult to include antennas into such electronic devices because there are typically real estate limitations within the electronic devices. These real estate limitations often inhibit the higher degree of device integration (e.g., passives and sensors) that are required when including antenna(s) within a flexible electronic device.

Another reason it is difficult to include antennas into such electronic devices is unless the antenna is of a certain size, the antenna is typically unable to maintain an adequate radiation efficiency. As an example, when an antenna becomes too small, the antenna may become unsuitable in some electronic devices that require the antenna to have a certain gain. It is also usually undesirable for the antenna to be too large because the electronic device that includes the antenna may also become too large thereby inhibiting user experience.

Therefore, a need exists for flexible/wearable computing devices that may integrate various antennas directly into a flexible medium. When an antenna is to be included into a flexible/wearable computing device, the antenna should be included without (i) requiring a significant amount of added power to properly operate the flexible/wearable computing device; and/or (ii) adding too much to the overall size of the flexible/wearable computing device.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The flexible integrated circuits described herein may provide design solutions for developing standard form-factor size flexible integrated circuits that incorporate a radiating element (e.g. an antenna). As examples, the antenna may be used for Wi-Fi or Bluetooth applications.

The flexible integrated circuits described herein may integrate a low-profile dipole antenna into a relatively small form-factor flexible electronic package. In some forms, the antenna counter-poise is ground independent in order to keep dipole antenna radiation efficiency consistent across various applications that utilize the flexible integrated circuits described herein.

Figure 1:
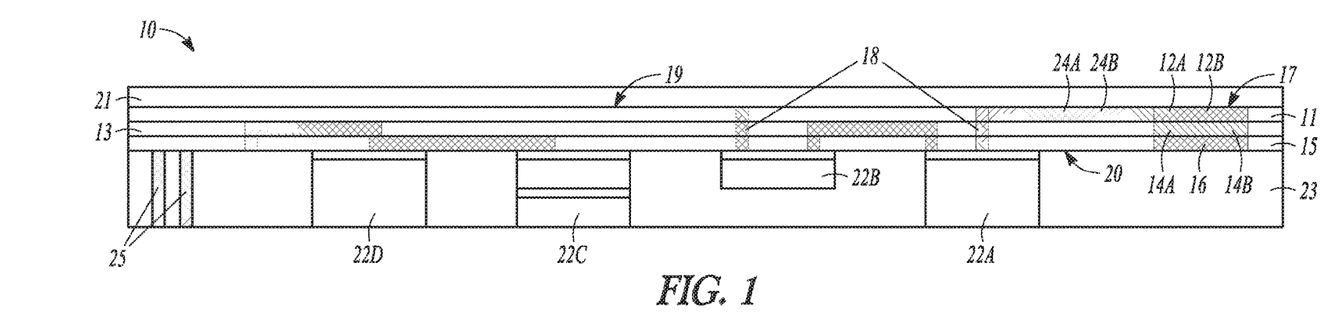
FIG. 1 is a schematic side view illustrating an example flexible integrated circuit.
Figure 2:
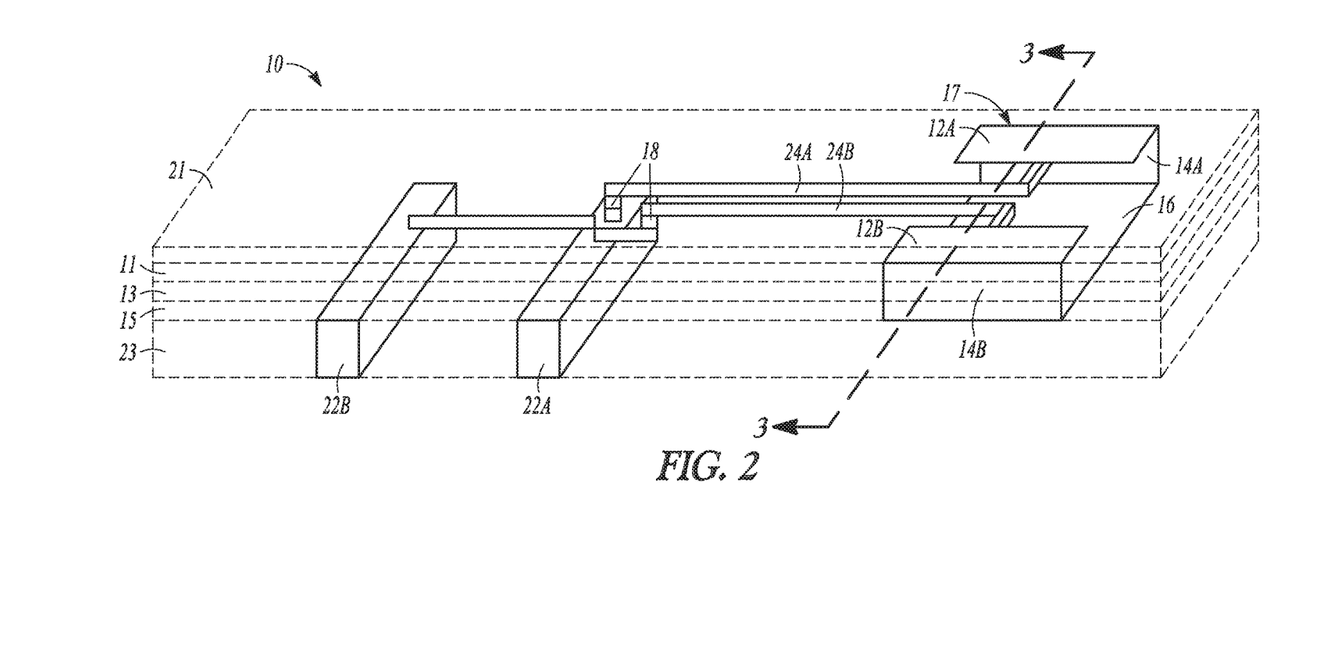
FIG. 2 is a perspective view of the example flexible integrated circuit shown in FIG. 1.
Figure 3:
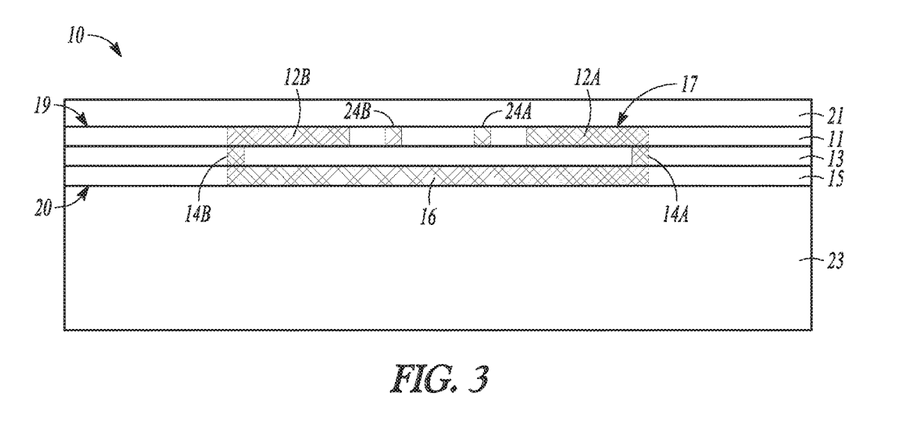
FIG. 3 is a schematic section view of the example flexible integrated circuit shown in FIG. 2 taken along line 3-3.

FIG. 1 is a schematic side view illustrating an example flexible integrated circuit 10. FIG. 2 is a perspective view of the example flexible integrated circuit 10 shown in FIG. 1. FIG. 3 is a schematic section view of the example flexible integrated circuit 10 shown in FIG. 2 taken along line 3-3.

The flexible integrated circuit 10 includes a first dielectric layer 11 having a first section 12A at one polarity and a second section 12B at an opposing polarity. The first section 12A and a second section 12B are separated by dielectric material within the first dielectric layer 11.

A second dielectric layer 13 includes a first a sidewall 14A that is electrically connected to the first section 12A of the first dielectric layer 11. The second dielectric layer 13 further includes a second sidewall 14B that is electrically connected to the second section 12B of the first dielectric layer 11.

A third dielectric layer 15 includes a base 16 that is electrically connected to the first sidewall 14A and a second sidewall 14B. The second dielectric layer 13 is between the first dielectric layer 111 and a third dielectric layer 15. The base 16, the first and second sidewalk 14A, 14B, and the first and second sections 12A, 12B form an antenna 17 that is configured to send or receive wireless signals. In some forms, the base 16, the first and second sidewalls 14A, 14B, and the first and second sections 12A, 12B may be formed of the same material or different materials (e.g., conductors).

The flexible integrated circuit 10 may further include conductive interconnects 18 that extend between any of the first, second or third dielectric layers 11, 13, 15. The number, type, arrangement and size of the conductive interconnects 18 will depend in part on the overall design of the flexible integrated circuit 10 as well as the application where the flexible integrated circuit 10 is to be used (among other factors).

It should be noted that although the base 16 is shown as having a rectangular shape, the base 16 may be any shape that is required by the design of the antenna 17. The shape of the base 16 will depend in part on the manufacturing considerations that are associated with fabricating the flexible integrated circuit 10 as well as the application where the flexible integrated circuit 10 is to be used (among other factors).

It should be noted that even though the first and second sidewalls 14A, 14B are shown as being rectangular, the first and second sidewalk 14A, 14B may have a variety of configurations. In addition, the flexible integrated circuit 10 may include additional dielectric layers besides second dielectric layer 13 that are between the first dielectric layer 11 and the third dielectric layer 15. In some forms, the additional dielectric layers may also form the first and second sidewalk 14A, 14B.

It should also be noted that even though the first and second sections 12A, 12B are shown as being rectangular, the first and second sections 12A, 12B may be different shapes depending on the application where the flexible integrated circuit 10 is to be used. In addition, the first section 12A and the second section 12B may be the same shape or be different shapes.

In the example flexible integrated circuit 10 shown in FIG. 3, the first dielectric layer 11 forms part of an upper surface 19 (see FIGS. 1 and 3) within the flexible integrated circuit 10. In addition, the third dielectric layer 15 forms part of a lower surface 20 (see FIGS. 1 and 3) within the flexible integrated circuit 10.

Figure 4:
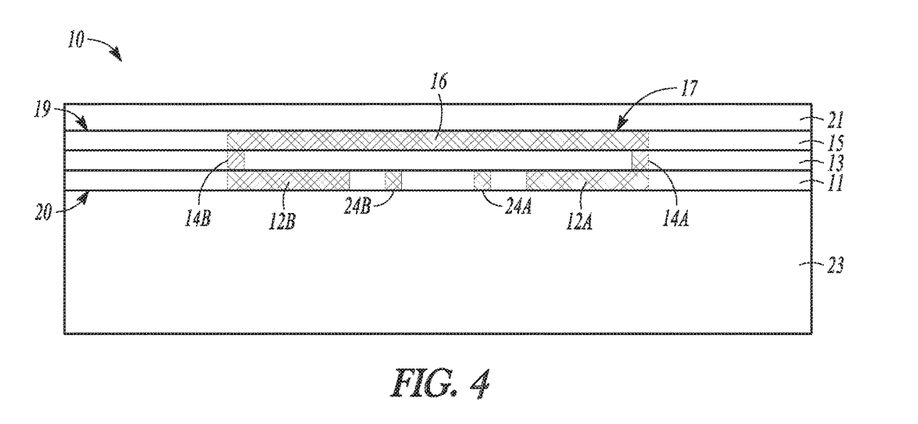
FIG. 4 is a schematic section view similar to FIG. 3 illustrating another example flexible integrated circuit.
Figure 5A:
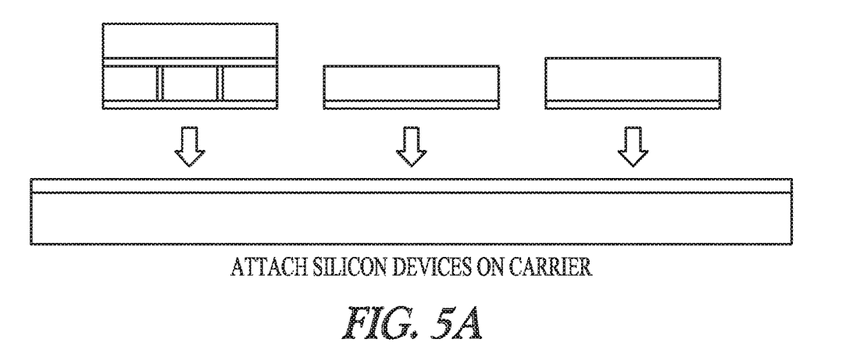
FIGS. 5A-5F illustrate example processes for fabricating the flexible integrated circuit shown in FIGS. 1-3.
Figure 5B:
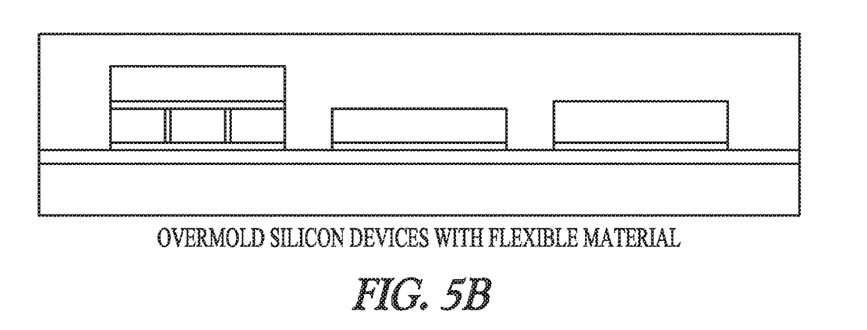
Figure 5C:
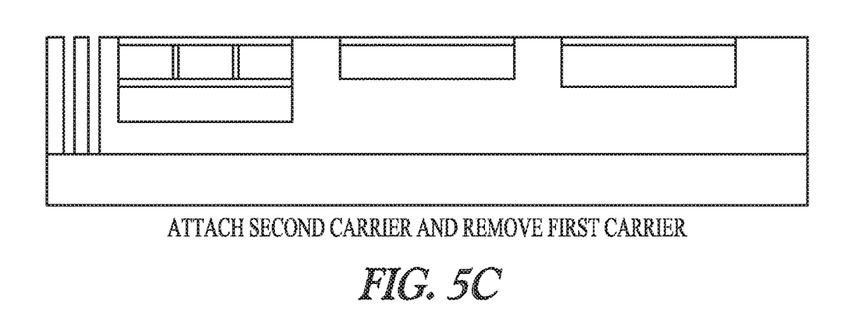
Figure 5D:
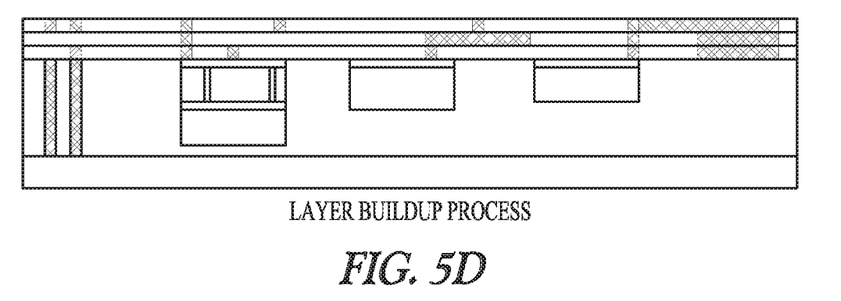
Figure 5E:
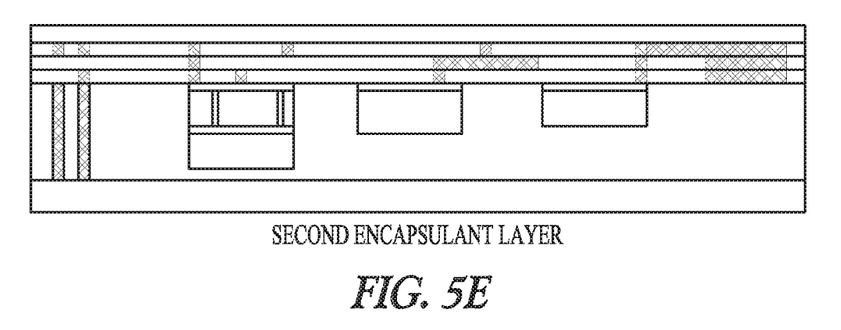
Figure 5F:
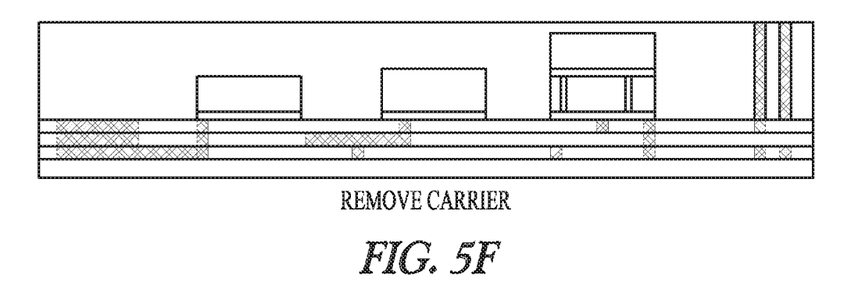

In the example flexible integrated circuit 10 shown in FIG. 4, the first dielectric layer 11 forms part of the lower surface 20 within the flexible integrated circuit 10. In addition, the third dielectric layer 15 forms part of the upper surface 19 within the flexible integrated circuit 10.

The flexible integrated circuit 10 may further include a first encapsulant 21 that is mounted to the first dielectric layer 11. The flexible integrated circuit 10 may also further include an electronic component 22A that is mounted to the third dielectric layer 15 such that the electronic component 22A is electrically connected to the third dielectric layer 15. In some forms, the electronic component 22A is configured to exchange signals with the antenna 17.

The flexible integrated circuit 10 may further include a second encapsulant 23 that is mounted to the third dielectric layer 15. The electronic component 22A may be at least partially embedded within the second encapsulant 23.

The flexible integrated circuit 10 may further include a first conductive routing 24A that exchanges signals between the electronic component 22A and the first section 12A of the antenna 17. The flexible integrated circuit 10 may further include a second conductive routing 24B that exchanges signals between the electronic component 22A and the second section 12B of the antenna 17. In some forms, the first conductive routing 24A and the second conductive routing 24B may carry signals between the first dielectric layer 11 and the third dielectric layer 15.

The flexible integrated circuit 10 may further include one or more additional electronic components 22B, 22C, 22D (see FIG. 1) that are mounted to the third dielectric layer 15 such that each electronic component 22A, 22B, 22C, 22D is electrically connected to the third dielectric layer 15. It should be noted that the electronic components 22A, 22B, 22C, 22D may include at least one of a sensor, power supply, active component, passive component, radio frequency device or a global positioning system (among other types of electronic components). The types of electronic components that are included in the flexible integrated circuit 10 will depend in part on the application where the flexible integrated circuit 10 is to be used (among other factors).

In some forms, one of the electronic components may be a radiofrequency device 22A (see FIGS. 1 and 2) that is configured to exchange signals with the antenna 17. In addition, another of the components 22B may be a processor that is configured to exchange signals with the radiofrequency device 22A.

The first encapsulant 21 and the second encapsulant 23 may be the same (or different) materials. As examples, the first and second encapsulants 21, 23 may be made from any of a variety of different materials, including polyester, polyimide, aramid, fiber-glass epoxy and silicone composites. Alternative materials include, but are not limited to, polysilloxanes, epoxy resins, acrylates, UV curable and O2/H2O initiated polyurethanes, benzocyclobutene, polyimide, polyamide, high-density polyethylene, BT resin, liquid crystal polymer, and polydimethylsiloxane.

The types of materials that are used for the first and second encapsulants 21, 23 will depend in part on manufacturing considerations that are associated with fabricating the flexible integrated circuit 10 as well as the degree of flexibility that is required in the applications where the flexible integrated circuit 10 is to be used (among other factors).

The first, second and third dielectric layers 11, 13, 15 may be the same (or different) materials. As an example, the first, second and third dielectric layers 11, 13, 15 may be polyimide dielectric layers. The type of materials that are chosen for the first, second and third dielectric layers 11, 13, 15 will depend on manufacturing considerations that are associated with fabricating the flexible integrated circuit 10 as well as the application where the flexible integrated circuit 10 is to be used (among other factors).

In some forms, the flexible integrated circuit 10 may include additional interconnects 25 (see FIG. 1). These additional interconnects 25 may be used for the flexible integrated circuit 10 to communicate with an external source (e.g., a power supply or some other electronic component). The number, type, arrangement and size of these additional interconnects 25 will depend in part on the degree of external communication that is required by the flexible integrated circuit 10 as well as manufacturing considerations that are associated with fabricating the flexible integrated circuit 10 (among other factors).

FIGS. 5A-5F illustrate example processes for fabricating the flexible integrated circuit 10 shown in FIGS. 1-3. It should be noted that the illustrated example processes may be performed in a different order or include different manufacturing techniques.

FIGS. 5A-5F illustrate that the processes may utilize one or more temporary carrier panels. The temporary carrier panels may have different configurations. As an example, a temporary carrier panel may have two copper layers that are separated by a weak layer to permit easy separation when separating items from the temporary carrier panel. It should be noted that a variety of configurations for the temporary carrier panel are contemplated and will depend in part on the materials and manufacturing processes that are utilized to fabricate the flexible integrated circuit 10.

It should be noted that in all of the processes that are shown and described herein, individual units may be singulated from a wafer panel. In addition, the singulated units may be encapsulated and/or attached to other electronic assemblies or electronic packages.

All of the illustrated processes and flow diagrams are merely examples and other processes, materials, components, configurations and attachment methods may be utilized. These example processes should not be viewed as limiting the scope of the flexible integrated circuits 10 described herein.

The flexible integrated circuit 10 described herein may permit the integration of antennas into relatively small form-factor flexible packaging architectures for a variety of applications (e.g., wearables). The flexible integrated circuit 10 described herein may also reduce (or eliminate) a sizeable reference plane that is required in many electronic devices that include antennas.

The antennas described herein may be ground plane independent. In other words, the antennas may not be constrained by a fixed ground plane of the electronic device (e.g., within a flexible substrate or a printed circuit board).

The flexible integrated circuits 10 described herein may also be fabricated in a cost effective manner without significant tradeoffs related to antenna gain efficiency. In other words, the antenna within the flexible integrated circuits 10 may maintain RF connectivity at high transfer speeds thereby enhancing user experience.

Figure 6:
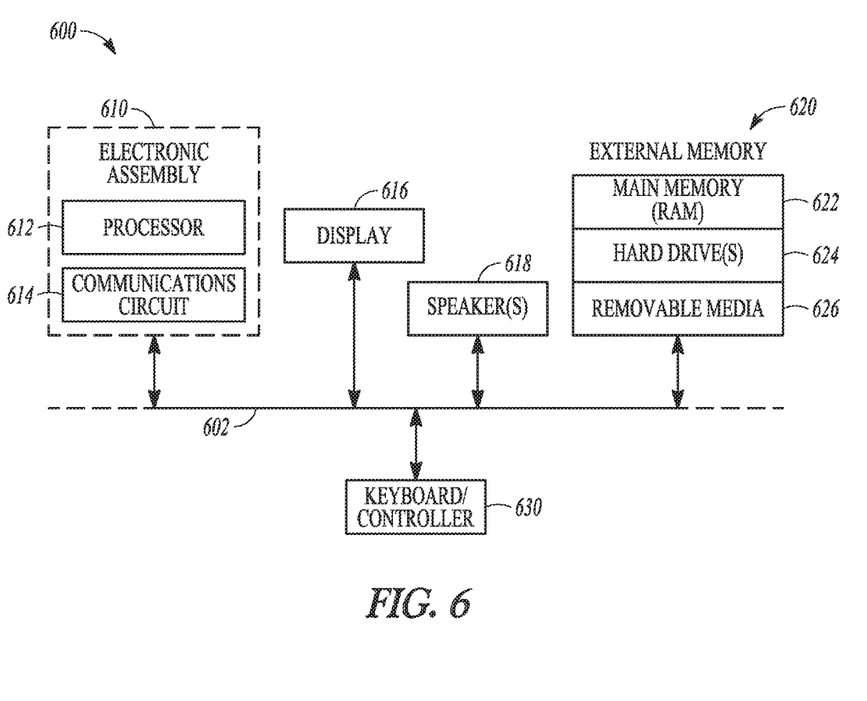
FIG. 6 is block diagram of an electronic apparatus that includes the flexible integrated circuits described herein.

FIG. 6 is a block diagram of an electronic apparatus 600 incorporating at least one flexible integrated circuit 10 described herein. Electronic apparatus 600 is merely one example of an electronic apparatus in which forms of the flexible integrated circuit 10 described herein may be used. Examples of an electronic apparatus 600 include, but are not limited to, personal computers, tablet computers, mobile telephones, game devices, MP3 or other digital media players, etc. In this example, electronic apparatus 600 comprises a data processing system that includes a system bus 602 to couple the various components of the electronic apparatus 600. System bus 602 provides communications links among the various components of the electronic apparatus 600 and may be implemented as a single bus, as a combination of busses, or in any other suitable manner.

An electronic apparatus 600 as describe herein may be coupled to system bus 602. The electronic apparatus 600 may include any circuit or combination of circuits. In one embodiment, the electronic apparatus 600 includes an electronic assembly 610 having a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic assembly 610 are a custom circuit, an application-specific integrated circuit (ASIC), or the like, such as, for example, one or more circuits (such as a communications circuit 614) for use in wireless devices like mobile telephones, tablet computers, laptop computers, two-way radios, and similar electronic systems. The IC can perform any other type of function.

The electronic apparatus 600 may also include an external memory 620, which in turn may include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

The electronic apparatus 600 may also include a display device 616, one or more speakers 618, and a keyboard and/or controller 630, which can include a mouse, trackball, touch pad, voice-recognition device, or any other device that permits a system user to input information into and receive information from the electronic apparatus 600.

To better illustrate the flexible integrated circuits 10 disclosed herein, a non-limiting list of examples is provided herein:

Example 1 includes a flexible integrated circuit. The flexible integrated circuit includes a first dielectric layer having a first section at one polarity and a second section at an opposing polarity, wherein the first section and the second section are separated by dielectric material within first dielectric layer; a second dielectric layer having a first side wall that is electrically connected to the first section and a second side wall that is electrically connected to the second section; and a third dielectric layer having a base that is electrically connected to the first side wall and the second side wall, wherein the second dielectric layer is between the first dielectric layer and the third dielectric layer, wherein the base, the first and second side walls and the first and second sections form an antenna that is configured to send or receive wireless signals.

Example 2 includes the flexible integrated circuit of example 1, and further including conductive interconnects that extend between the first dielectric layer and the third dielectric layer.

Example 3 includes the flexible integrated circuit of any one of examples 1-2, wherein the first dielectric layer forms part of an upper surface of the flexible integrated circuit and the third dielectric layer forms part of a lower surface of the flexible integrated circuit.

Example 4 includes the flexible integrated circuit of any one of examples 1-3, wherein the first dielectric layer forms part of a lower surface of the flexible integrated circuit and the third dielectric layer forms part of an upper surface of the flexible integrated circuit.

Example 5 includes the flexible integrated circuit of examples 1-4, and further including a first encapsulant mounted to the first dielectric layer.

Example 6 includes the flexible integrated circuit of any one of examples 1-5, and further including an electronic component mounted to the third dielectric layer such that the electronic component is electrically connected to the third dielectric layer.

Example 7 includes the flexible integrated circuit of any one of examples 1-6, wherein the electronic component is configured to exchange signals with the antenna.

Example 8 includes the flexible integrated circuit of any one of examples 1-7, and further including a second encapsulant mounted to the third dielectric layer such that the electronic component is at least partially embedded within the second encapsulant.

Example 9 includes the flexible integrated circuit of any one of examples 1-8, and further including a first conductive routing that exchanges signals between the electronic component and the first section of the antenna; and a second conductive routing that exchanges signals between the electronic component and the second section of the antenna.

Example 10 includes the flexible integrated circuit of any one of examples 1-9, wherein the first conductive routing and the second conductive routing carry signals between the first dielectric layer and the third dielectric layer Example 11 includes the flexible integrated circuit of any one of examples 1-10, and further including one or more additional electronic components mounted to the third dielectric layer such that each electronic component is electrically connected to the third dielectric layer Example 12 includes the flexible integrated circuit of example 11, wherein the electronic components include at least one of a sensor, power supply, active component, passive component, radio frequency device or global positioning system.

Example 13 includes the flexible integrated circuit of examples 8-12, wherein the first encapsulant and the second encapsulant are different materials, and wherein the first, second and third dielectric layers are polyimide dielectric layers.

Example 14 includes the flexible integrated circuit of examples 8-13, wherein one of the electronic components is a radio frequency device that is configured to exchange signals with the antenna and another of the components is a processor that is configured to exchange signals with the radio frequency device.

Example 15 includes a flexible integrated circuit. The flexible integrated circuit includes a first dielectric layer having a first section at one polarity and a second section at an opposing polarity, wherein the first section and the second section are separated by dielectric material within first dielectric layer; a second dielectric layer having a first side wall that is electrically connected to the first section and a second side wall that is electrically connected to the second section; a third dielectric layer having a base that is electrically connected to the first side wall and the second side wall, wherein the second dielectric layer is between the first dielectric layer and the third dielectric layer, wherein the base, the first second side walls and the first and second sections form an antenna that is configured to send or receive wireless signals; a first encapsulant mounted to the first dielectric layer; a plurality of electronic components mounted to the third dielectric layer such that the plurality of electronic components is electrically connected to the third dielectric layer; and a second encapsulant mounted to the third dielectric layer such that the electronic component is at least partially embedded within the second encapsulant.

Example 16 includes the flexible integrated circuit of example 15, and further including a first conductive routing that exchanges signals between at least one of the electronic components and the first section of the antenna; and a second conductive routing that exchanges signals between the same electronic component and the second section of the antenna.

Example 17 includes the flexible integrated circuit of any one of examples 15-16, wherein one of the electronic components is a radio frequency device that is configured to exchange signals with the antenna and another of the electronic components is a processor that is configured to exchange signals with the radio frequency device.

Example 18 includes a flexible integrated circuit. The flexible integrated circuit includes a first dielectric layer having a first section at one polarity and a second section at an opposing polarity, wherein the first section and the second section are separated by dielectric material within first dielectric layer; a second dielectric layer having a first side wall that is electrically connected to the first section and a second side wall that is electrically connected to the second section; a third dielectric layer having a base that is electrically connected to the first side wall and the second side wall, wherein the second dielectric layer is between the first dielectric layer and the third dielectric layer, wherein the base, the first second side walls and the first and second sections form an antenna that is configured to send or receive wireless signals; a first encapsulant mounted to the third dielectric layer; a plurality of electronic components mounted to the first dielectric layer such that the plurality of electronic components is electrically connected to the first dielectric layer; and a second encapsulant mounted to the first dielectric layer such that the electronic component is at least partially embedded within the second encapsulant.

Example 19 includes the flexible integrated circuit of example 18, and further including a first conductive routing that exchanges signals between at least one of the electronic components and the first section of the antenna; and a second conductive routing that exchanges signals between the same electronic component and the second section of the antenna.

Example 20 includes the flexible integrated circuit of any of examples 18-19, wherein one of the electronic components is a radio frequency device that is configured to exchange signals with the antenna and another of the electronic components is a processor that is configured to exchange signals with the radio frequency device.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. § 1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A flexible integrated circuit comprising:
a first dielectric layer having a first conductive section at one polarity and a second conductive section at an opposing polarity, wherein the first conductive section and the second conductive section are separated by dielectric material within the first dielectric layer;
a second dielectric layer having a first conductive side wall that is electrically connected to the first conductive section; and
a third dielectric layer having a conductive base that is electrically connected to the first conductive side wall, wherein the second dielectric layer is between the first dielectric layer and the third dielectric layer, wherein the conductive base, the first conductive side wall and the first and second conductive sections form an antenna that is configured to send wireless signals.

2. The flexible integrated circuit of claim 1, wherein the second dielectric layer includes a second conductive side wall that is electrically connected to the second conductive section.

3. The flexible integrated circuit of claim 2, wherein the third dielectric layer is electrically connected to the second conductive side wall.

4. The flexible integrated circuit of claim 1, wherein the conductive base, the first and second conductive side walls and the first and second conductive sections form the antenna that is configured to receive wireless signals.

5. The flexible integrated circuit of claim 1, further comprising conductive interconnects that extend between the first dielectric layer and the third dielectric layer.

6. The flexible integrated circuit of claim 5, wherein the first dielectric layer forms part of an upper surface of the flexible integrated circuit and the third dielectric layer forms part of a lower surface of the flexible integrated circuit.

7. The flexible integrated circuit of claim 6, wherein the first dielectric layer forms part of a lower surface of the flexible integrated circuit and the third dielectric layer forms part of an upper surface of the flexible integrated circuit.

8. The flexible integrated circuit of claim 6, further comprising:
a first encapsulant mounted to the first dielectric layer; and
an electronic component mounted to the third dielectric layer such that the electronic component is electrically connected to the third dielectric layer.

9. The flexible integrated circuit of claim 8, wherein the electronic component is configured to exchange signals with the antenna, and further comprising a second encapsulant mounted to the third dielectric layer such that the electronic component is at least partially embedded within the second encapsulant.

10. The flexible integrated circuit of claim 8, further comprising:
a first conductive routing that exchanges signals between the electronic component and the first conductive section of the antenna; and
a second conductive routing that exchanges signals between the electronic component and the second conductive section of the antenna.

11. The flexible integrated circuit of claim 10, wherein the first conductive routing and the second conductive routing carry signals between the first dielectric layer and the third dielectric layer.

12. The flexible integrated circuit of claim 8, further comprising one or more additional electronic components mounted to the third dielectric layer such that each electronic component is electrically connected to the third dielectric layer, wherein the electronic components include at least one of a sensor, power supply, active component, passive component, radio frequency device or global positioning system.

13. The flexible integrated circuit of claim 12, wherein one of the electronic components is a radio frequency device that is configured to exchange signals with the antenna and another of the components is a processor that is configured to exchange signals with the radio frequency device.

14. A flexible integrated circuit comprising:
a first dielectric layer having a first conductive section at one polarity and a second conductive section at an opposing polarity, wherein the first conductive section and the second conductive section are separated by dielectric material within the first dielectric layer;
a second dielectric layer having a first conductive side wall and a second conductive side wall that are electrically connected to the first conductive section; and
a third dielectric layer having a conductive base that is electrically connected to the first side wall and the second side wall, wherein the second dielectric layer is between the first dielectric layer and the third dielectric layer, wherein the conductive base, the first and second conductive side walls and the first and second conductive sections form an antenna that is configured to send or receive wireless signals.

15. The flexible integrated circuit of claim 14, wherein the second side wall is electrically connected to the second conductive section.

16. The flexible integrated circuit of claim 15, further comprising:
a first conductive routing that exchanges signals between at least one of the electronic components and the first conductive section of the antenna; and
a second conductive routing that exchanges signals between the same electronic component and the second conductive section of the antenna.

17. A flexible integrated circuit comprising:
a first dielectric layer having a first conductive section at one polarity and a second conductive section at an opposing polarity, wherein the first conductive section and the second conductive section are separated by dielectric material within the first dielectric layer;
a second dielectric layer having a first conductive side wall and a second conductive side wall that are electrically connected to the first conductive section; and
a third dielectric layer that is electrically connected to the first conductive side wall and the second conductive side wall, wherein the second dielectric layer is between the first dielectric layer and the third dielectric layer, wherein the first and second conductive side walls and the first and second conductive sections form an antenna that is configured to send wireless signals.

18. The flexible integrated circuit of claim 17, further comprising:

a first conductive routing that exchanges signals between at least one of the electronic components and the first conductive section of the antenna; and a second conductive routing that exchanges signals between the same electronic component and the second conductive section of the antenna.

19. The flexible integrated circuit of claim 17, wherein the third dielectric layer includes a conductive base such that the conductive base, the first and second conductive side walls and the first and second conductive sections form the antenna that is configured to receive wireless signals.

\* \* \* \* \*